United States Patent

Yoon

[19]

[11] Patent Number: 6,003,225
[45] Date of Patent: Dec. 21, 1999

[54] FABRICATION OF ALUMINUM-BACKED PRINTED WIRING BOARDS WITH PLATED HOLES THEREIN

[75] Inventor: Sunghee Yoon, Lakewood, Calif.

[73] Assignee: Hughes Electronics Corporation, Los Angeles, Calif.

[21] Appl. No.: 08/982,012

[22] Filed: Dec. 1, 1997

[51] Int. Cl.[6] .................................................. H05K 3/10
[52] U.S. Cl. .............................. 29/852; 205/125; 427/97
[58] Field of Search .............................. 29/852; 205/125, 205/126, 131, 177, 181, 182, 213, 215, 148; 427/96, 97, 98

[56] References Cited

U.S. PATENT DOCUMENTS

| | | | |
|---|---|---|---|
| 3,483,615 | 12/1969 | Gottfried | 29/852 |
| 3,934,335 | 1/1976 | Nelson | 29/625 |
| 4,024,631 | 5/1977 | Castillero | 29/625 |
| 4,477,952 | 10/1984 | Crescenzi et al. | 29/25.35 |
| 4,633,035 | 12/1986 | McMonagle | 174/257 |
| 4,915,796 | 4/1990 | Denofrio | 204/15 |
| 5,071,359 | 12/1991 | Arnio et al. | 439/91 |
| 5,189,261 | 2/1993 | Alexander et al. | 174/263 |
| 5,262,281 | 11/1993 | Bauer et al. | 430/323 |
| 5,462,892 | 10/1995 | Gabriel | 437/189 |

*Primary Examiner*—Lee Young
*Assistant Examiner*—Davide Caputo
*Attorney, Agent, or Firm*—Terje Gudmestad; Georgann S. Grunebach; Michael W. Sales

[57] ABSTRACT

A printed wiring board has an aluminum backing, a dielectric layer overlying the aluminum backing, and a copper layer overlying the dielectric layer. Holes are drilled through the copper and the dielectric layers, and either partially or fully through the aluminum backing, and plated to provide a conductive path between the copper layer and the aluminum backing. Tin-lead traces are applied to the upper surface of the copper layer and the copper layer is etched to define conductive paths. The copper exposed and aluminum exposed surfaces are protected so as to permit processing of the printed wiring board in otherwise-incompatible etchants and other solutions.

13 Claims, 4 Drawing Sheets

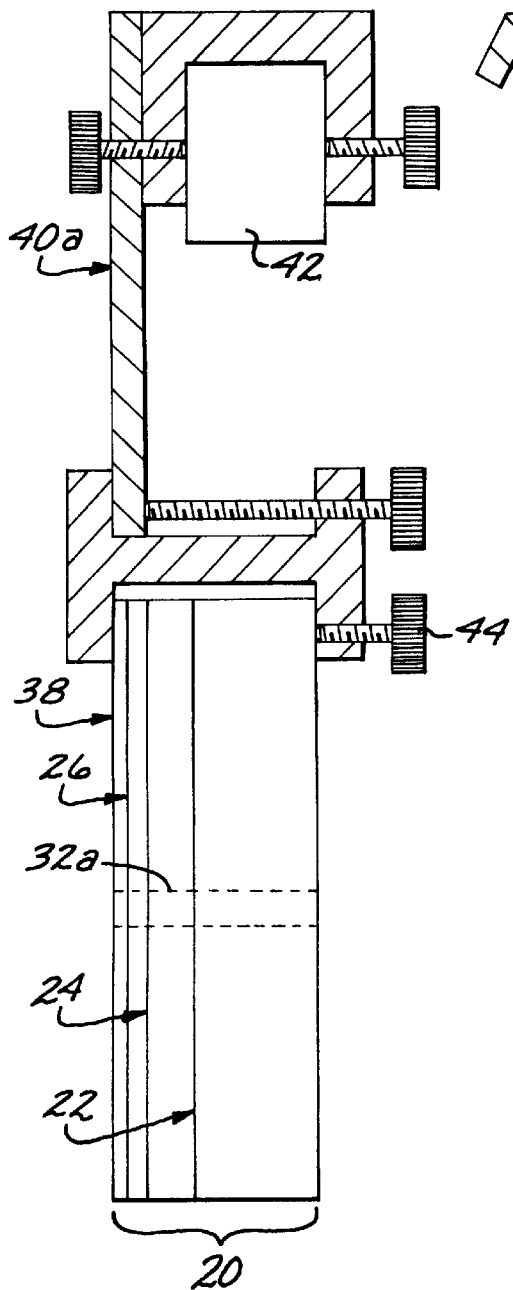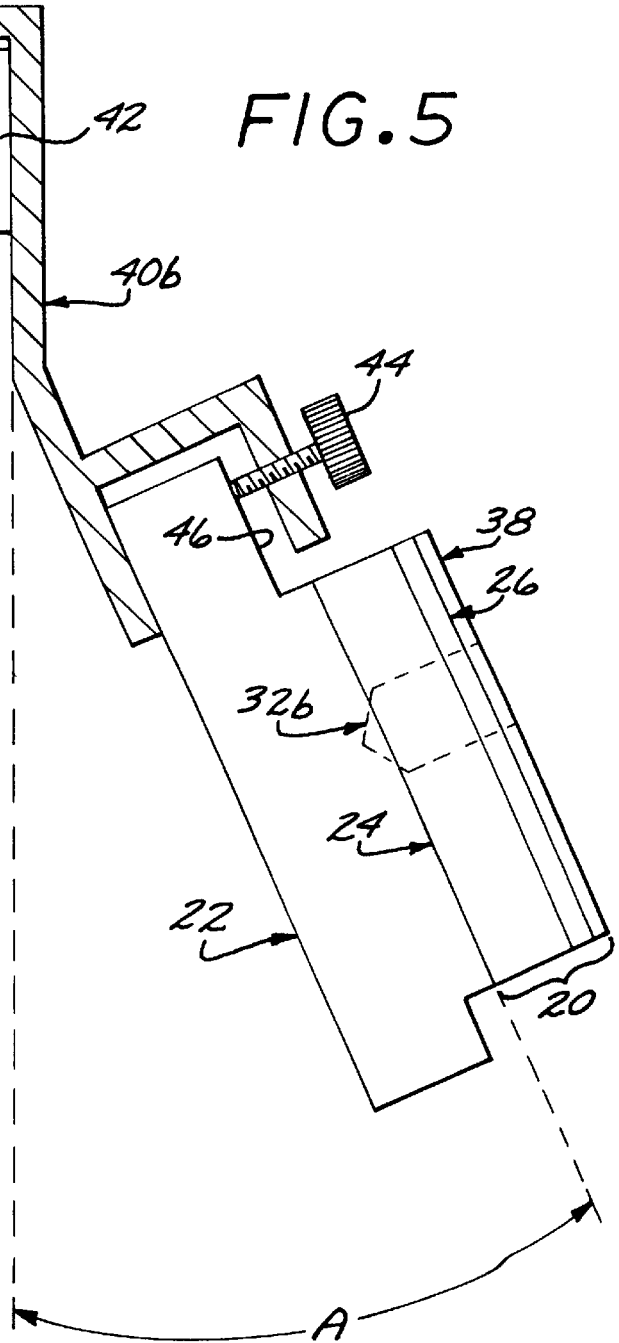

FABRICATION OF ALUMINUM-BACKED PRINTED WIRING BOARDS WITH PLATED HOLES THEREIN

BACKGROUND OF THE INVENTION

This invention relates to printed wiring boards (PWBs) with a copper/dielectric/aluminum structure, and, more particularly, to the processing of such PWBs to produce plated holes therein.

Copper-clad laminates with an aluminum backing are patterned with electrical circuitry and used in a number of applications such as high-frequency microwave circuits. Such laminates, termed printed wiring boards or PWBs, include an aluminum backing, a layer of a dielectric such as a resin overlying the aluminum backing, and a patterned copper layer overlying the dielectric layer. It is often necessary to provide holes through the copper layer and the dielectric layer, and into the aluminum backing. The bores of the holes are plated with an electrical conductor so that they provide electrical continuity between the copper layer and the aluminum backing. The holes may extend through the aluminum backing or may be blind holes terminating within the aluminum backing.

The uniform plating of the bores with sufficient thickness, and in an economical manner, is difficult, for several reasons. The holes are long and narrow, making difficult the uniform plating of the bore with minimal defects. Bubbles may become trapped within the bores and physically block the subsequent plating. Copper and aluminum are chemically dissimilar. Chemicals used to process copper, such as etchants, often attack aluminum, and vice versa.

A number of techniques have been used to accomplish the plating of the bores in conventional low-frequency (less than 500 MHZ) PWBs. Since these low-frequency PWBs have copper layers on both the top and bottom sides, the plating of the bores is relatively simple. In industry, electroless copper plating or direct metallization is used to provide electrical continuity between the top and bottom sides. When there is an aluminum backing, however, the plating of the bores is difficult without proper processing sequences and techniques. In one approach, the conductive copper layer is applied by a physical technique such as physical vapor deposition. This approach provides an adherent copper coating on the readily exposed surface of the bore, but uniform deposition of copper inside deep holes is difficult, with the result that the electrical path between the copper and aluminum may be unreliable.

There is a need for an improved approach to the production of aluminum-backed PWBs having blind or through holes therein. The present invention fulfills this need, and further provides related advantages.

SUMMARY OF THE INVENTION

The present invention provides a method for producing copper/dielectric/aluminum printed wiring boards (PWBs) having plated holes therein. The approach has a high yield of good product with reliably conductive bores extending between the copper layer and the aluminum backing, while ensuring that the copper and aluminum are not chemically damaged during the processing. The approach is effective for producing PWBs with either through holes or blind holes terminating in the aluminum backing. Although a large number of steps are involved, these steps are amenable to mass production methods wherein large numbers of PWBs are prepared.

In accordance with the invention, there is provided a method of manufacturing a printed wiring board from a starting material panel having an aluminum backing with an aluminum exposed surface, a dielectric layer overlying and contacting the aluminum backing, and a copper layer overlying and contacting the dielectric layer with a copper exposed surface. The method includes removing contaminants from the aluminum exposed surface and the copper exposed surface, masking the copper exposed surface, and forming a hole from the copper exposed surface into the aluminum backing. The panel is supported from a plating rack having an electrical contact to the aluminum backing but not to the copper layer, the aluminum exposed surface is chemically cleaned, a zinc coating is applied to the aluminum exposed surface, a nickel plating is electrolytically applied over the aluminum exposed surface, and then a copper-plating is electrolytically applied over the nickel plating. If the copper is plated in a cyanide copper bath, the nickel plating prior to the copper plating is not necessary because the zinc-coated aluminum surface is stable in the cyanide copper bath. However, the cyanide copper bath is not often used in the PWB industry, due to the strictly regulated cyanide waste discharge.

The panel is removed from the plating rack, and the masking is removed from the copper exposed surface. The conductive coating is formed in the bore by electrolessly applying a copper flash to the entire surface, masking that portion of the copper exposed surface remote from the hole, electrolytically applying a bore copper plating to a bore surface of the hole and the copper exposed surface immediately adjacent to the hole, and thereafter applying a bore nickel plating overlying the bore copper plating, and a bore gold plating overlying the bore nickel plating to protect the copper plating of the bore during the copper etching in a later stage. The method further includes removing the masking from the copper exposed surface, applying a mask overlying the aluminum-face copper plating, patterning the copper exposed surface, depositing a layer of a tin-lead alloy overlying the copper exposed surface so that a tin-lead pattern is formed through openings in the pattern on the copper exposed surface, and removing the tin-lead alloy from the copper surface adjacent to the hole and from the hole bore surface. The panel is machined or otherwise worked to provide it the necessary physical form. After machining, new exposed aluminum is present as a result of the machining that must be protected before further processing. Protection is achieved by applying a zinc coating to the aluminum exposed surface, electrolytically or electrolessly applying a nickel plating over the aluminum exposed surface, and electrolytically or electrolessly applying a gold plating over the nickel plating. The masking is removed from the panel, and the copper which is not protected by either gold or tin-lead plating is removed using copper etching solutions.

The conventional electroless copper plating approach does not use the zinc coating process because there is no exposed aluminum in the conventional printed wiring boards, resulting in plating blisters on the aluminum surfaces. The conventional zinc coating process of plating on aluminum uses a very concentrated alkaline solution at an elevated temperature of about 150° F. and acidic solutions for a relatively long immersion time. This conventional approach causes peeling of the masking material by alkaline chemical attack and etching away of the copper underneath the masking by acidic chemical attack. The zinc plating process of the present invention requires only very short immersion times in acidic solutions and is performed at room temperature in both alkaline and acidic solutions to avoid the peeling of the masking and to protect the copper from being etched.

The approach of the invention is operable with through holes that extend entirely through the copper, the dielectric, and the aluminum. It is also operable with blind holes that extend entirely through the copper and the dielectric, but terminate in the aluminum. However, where the hole is a blind hole, there is a tendency for bubbles to be trapped within the hole during metal deposition. To encourage the bubbles to disengage from the bore of the hole and float away, the panel is held at an angle of from about 25 to about 45 degrees from the vertical with the opening of the hole facing upwardly. The panel is mechanically pulsed and/or vibrated to dislodge any bubbles that otherwise might remain in the holes.

The present approach is particularly useful in conjunction with high-frequency (greater than 500 MHZ) circuits for applications in satellite communications. This technology permits large size PWBs, such as 18 inches by 24 inches, to be fabricated, as compared with a maximum size of about 2 inches by 2 inches for conventional alumina substrates. It is not necessary to solder the aluminum-backed PWBs to heat sinks because the aluminum backing itself acts as a heat sink. Conventional numerically controlled drilling and machining operations can be used with the aluminum-backed PWBs, rather than the slower and more costly laser machining required for alumina substrates.

The present approach provides a reliable procedure for producing aluminum-backed PWBs with plated holes therein. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 4 is a side elevational view of a plating fixture for plating panels with through holes; and FIG. 5 is a side elevational view of a plating fixture for plating panels with blind holes.

DETAILED DESCRIPTION OF THE INVENTION

Figure 1:
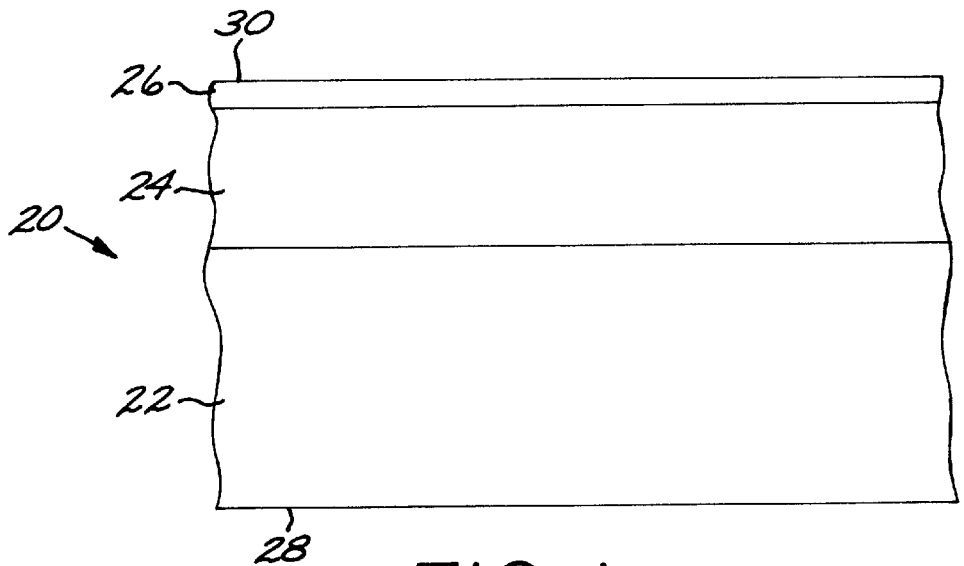
FIG. 1 is a sectional view of a panel used to form a printed wiring board.

FIG. 1 is an elevational view of a preferred starting-material panel 20 used in preparing a printed wiring board. The panel 20 includes at least three elements that are bonded together in a stacked, facing array. The panel 20 includes an aluminum backing 22, a dielectric layer 24 overlying and contacting the aluminum backing 22, and a copper layer 26 overlying and contacting the dielectric layer 24. The aluminum backing 22 has an aluminum exposed surface 28, and the copper layer 26 has a copper exposed surface 30. In the following discussion, the exposed surfaces of the panel at intermediate stages of fabrication processing will retain these terms, "aluminum exposed surface 28" and "copper exposed surface" 30, even when covered with masks, coatings, or other layers, for clarity.

The aluminum backing 22 is an aluminum alloy. The dielectric layer 24 may be any operable dielectric material, but is preferably a ceramic-filled or glass-fiber-reinforced organic polymer, such as is available from Rogers Corporation. The copper layer 26 is pure copper. By way of example, in one form the copper layer 26 is about 0.00035 inch thick, the dielectric layer 24 is about 0.025 inch thick, and the aluminum backing 22 is about 0.062 inch thick. These dimensions are presented as an illustration and not a limitation. Panels 20 of this type are known in the art and are available commercially.

Figure 2:
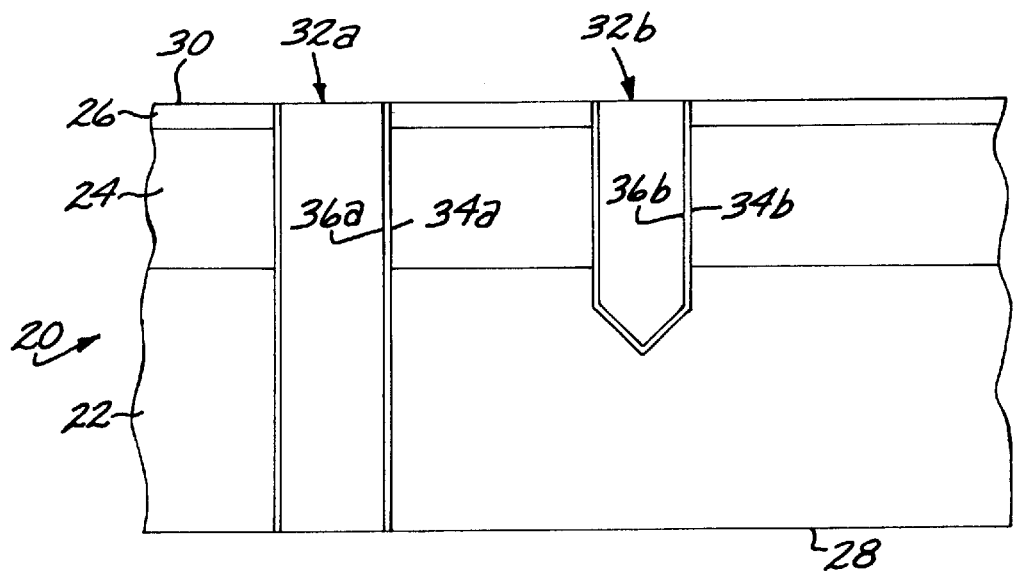
FIG. 2 is the same sectional view of the panel shown in FIG. 1, with a plated through hole and a plated blind hole therein.

For some applications, it is necessary that there be an electrical continuity path between the copper layer 26 and the aluminum backing 22. One approach for achieving such continuity is through the use of holes whose bores are plated with an electrical conductor such as copper, which provides a conductive path between the copper layer 26 and the aluminum backing 22. FIG. 2 illustrates a through hole 32a having a bore 34a with a copper coating 36a thereon. The through hole 32a extends entirely through the copper layer 26, the dielectric layer 24 and the aluminum layer 22. FIG. 2 also illustrates a blind hole 32b having a bore 34b with a copper coating 36b thereon. The blind hole 32b extends entirely through the copper layer 26 and the dielectric layer 24. The blind hole 32b extends part of the way, but not all of the way, through the aluminum backing 22. Because FIGS. 1 and 2 are not drawn to scale, the manufacturing advantages of the blind hole 32b over the through hole 32a may not be apparent. However, in the illustrative case discussed above, the aluminum backing 22 has a thickness over 175 times greater than the copper layer 26. If the hole 32 performs only the electrical continuity function discussed above and not other functions such as mechanical connection or alignment, the use of the blind hole 32b offers the advantages of faster hole drilling and less-complex processing steps. However, the uniform plating in the blind holes is difficult.

Figure 3A:
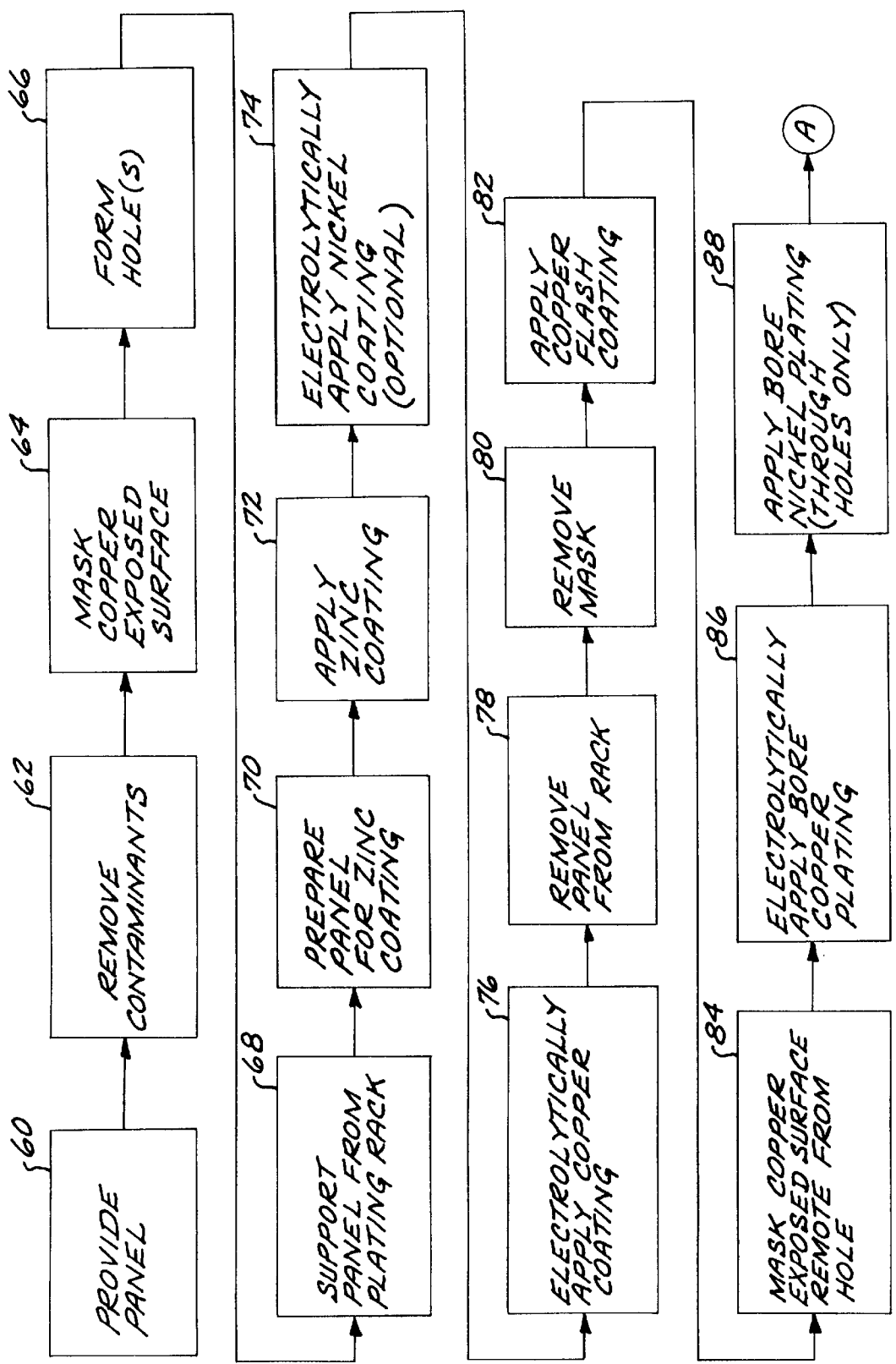
FIG. 3 is a process flow diagram for the preferred approach of the invention.
Figure 3B:
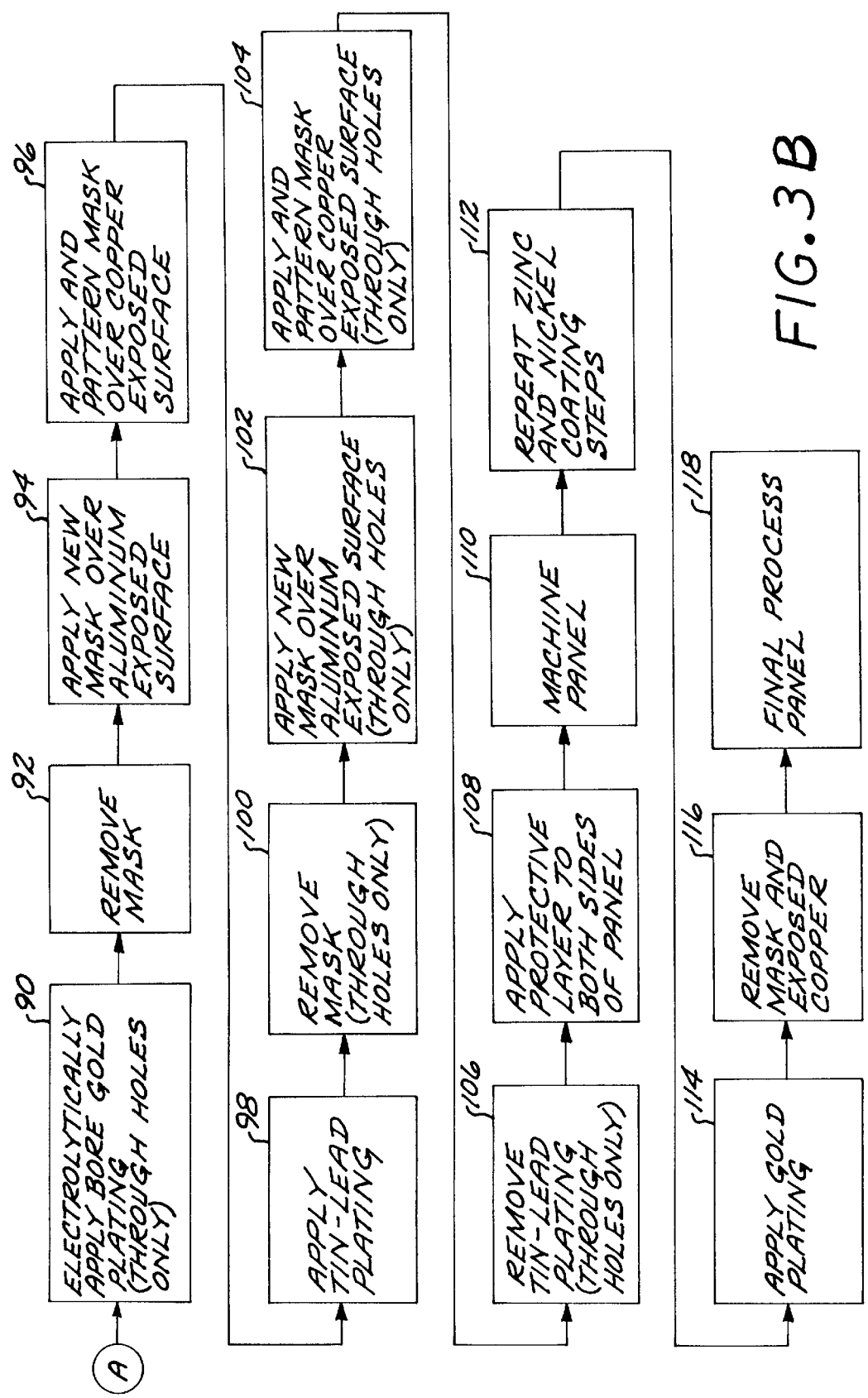

FIG. 3 depicts a preferred approach for processing the starting panel as shown in FIG. 1 to the final panel shown in FIG. 2, for both through holes and blind holes. The panel 20 as shown in FIG. 1 is provided, numeral 60. Any previously applied protective layers and/or contaminants (collectively, "contaminants") are removed from the exposed surfaces 28 and 30 by appropriate means, numeral 62. For example, a small amount of material may be machined away from the aluminum exposed surface 28, as for example about 0.002 inches. The exposed surfaces 28 and 30 may be washed and degreased by conventional procedures. In some cases, a thin aluminum protective layer (not shown) is present on the copper exposed surface 30. This protective layer may be removed by masking the aluminum exposed surface 28 and immersing the panel in concentrated hydrochloric acid or its equivalent to remove the aluminum protective layer.

The copper exposed surface 30 is masked to protect it, numeral 64, if not already masked in the preceding step 62. Any appropriate protective mask material may be used, but preferably a conventional organic photoresist or its equivalent is used. The mask 38 on the copper exposed surface 30 protects the copper from attack in solutions containing nitric acid that are employed in the following steps.

The hole(s) 32 are formed into the panel 20, numeral 66, typically by drilling. The holes may be through holes 32a or blind holes 32b. The holes may be either the electrical continuity holes discussed previously, or they may be tooling holes used to hold and position the panel during subsequent operations. All burrs or other apparent defects resulting from forming the holes 32 are removed prior to proceeding.

The panel 20 is supported from a plating rack 40a or 40b, numeral 68. The plating rack 40a or 40b may be either a "straight" rack 40a, as shown in FIG. 4, or a "bent" rack 40b, as shown in FIG. 5, which supports the panel 20 at an angle A to the vertical of from about 25 to about 45 degrees. The plating rack 40a or 40b is configured to support the panel 20 from a cathode bar 42 in an electrolytic plating bath. The panel 20 is affixed to the plating rack 40a or 40b with a contact, in the illustrated case a contact screw 44, through which electrical contact is made only to the aluminum backing 22. The copper layer 26 is isolated to prevent plating onto any unprotected regions such as edges. In the embodiment of FIG. 4, there is no electrical contact to the copper layer 26 due to the presence of the mask 38. In the embodiment of FIG. 5, there is no electrical contact to the copper layer 26 because the contact to the aluminum backing 22 is made within a slot 46 cut into the panel 20. In the embodiment of FIG. 5, the panel 20 is oriented so that an opening of the blind hole 32b angles upwardly rather than downwardly.

The "straight" rack 40a is used when the hole 32 is a through hole 32a, because experience has shown that bubbles are seldom if ever captured inside the through hole during electroplating. Such a captured bubble prevents uniform electroplating on the bore of the hole. The "bent" rack 40b is used when the hole 32 is a blind hole 32b (or when there are both through holes and blind holes in the panel). The "bent" rack 40b angles the opening of the hole upwardly to permit bubbles formed inside the hole to float upwardly. Additionally, the cathode bar 42, and thence the rack 40b and the panel 20, are mechanically pulsed and/or electrically vibrated (collectively, "vibrated" herein) during the electrodeposition process to dislodge any bubbles that otherwise might remain in the holes.

The panel is cleaned and prepared for zinc coating, numeral 70, by any operable approach. In the preferred processing, the panel supported on the rack is immersed in an alkaline cleaning solution containing sodium metasilicate and trisodium phosphate, such as Enprep NE-7 Improved, about 45 grams per liter (Enthone-OMI, Inc.), to remove any residual organic contaminants on the aluminum exposed surface 28 and thereafter rinsed in water. The panel supported on the rack is next immersed in an aluminum etch cleaning solution containing sodium hydroxide such as Enprep 14, about 45 grams per liter (Enthone-OMI, Inc.) to microetch and clean the aluminum exposed surface 28, and thereafter rinsed in water. The panel supported on the rack is next immersed in an aluminum desmutting solution containing ammonium bifluoride, sulfuric acid, and nitric acid such as Actane 70, about 60 grams per liter (Enthone-OMI, Inc.) to remove aluminum smuts from the aluminum exposed surface 28, and thereafter rinsed in water. The panel supported on the rack is next immersed in a concentrated nitric acid solution to remove any residual oxide layer from the aluminum exposed surface 28 and thereafter rinsed in water.

Zinc is applied to the aluminum exposed surface, numeral 72, by any operable method. Preferably, the zinc is applied by immersing the panel supported on the rack in a zincating solution containing sodium hydroxide and zinc oxide, such as Alumon EN, about 25 percent by volume (Enthone-OMI, Inc.) for about 30 to about 60 seconds at room temperature, and thereafter rinsing with water. Zinc applied in this fashion is often rough and porous. To improve the nature of the zinc, the first-deposited zinc is removed by immersing the panel supported on the rack in nitric acid to remove at least some of the zinc. The zincating of step 72 is then repeated. If the surface is still rough, the removal of zinc by immersing in nitric acid and step 72 may be repeated, for a total of three zincating treatments. In most cases, this triple zincating is sufficient to produce a smooth zinc deposit.

The aluminum is next protected with a nickel layer and a copper layer applied over the zinc. An aluminum-face nickel plating is electrolytically applied over the aluminum exposed surface 28 (previously treated with zinc), numeral 74. If the copper plating is deposited from a cyanide-containing copper bath, the nickel plating is optional due to the compatibility of zinc in the cyanide-containing copper bath. An aluminum-face copper plating is electrolytically applied over the aluminum exposed surface 28 (previously treated with zinc and then covered with the aluminum-face nickel plating), numeral 76. The nickel plating is deposited from a conventional nickel sulfamate bath containing nickel sulfamate, nickel bromide, and boric acid, or its equivalent. The copper plating is deposited from a conventional acid copper bath containing copper sulfate, sulfuric acid, chloride ion, and a brightener, or its equivalent. The panel 20 is removed from the rack 40, numeral 78.

The mask 38 is removed from the copper exposed surface 30, numeral 80. Removal is accomplished by immersing the panel in a photoresist stripper.

A copper flash coating is applied to all exposed surfaces, numeral 82, including the copper exposed surface 30 and the bore 34. This coating is applied in two stages. First, the panel is contacted to a conventional electroless copper plating solution after the panel is cleaned, catalyzed, and activated in a conventional electroless copper process, producing a first electroless copper coating about 0.00003 inch thick. A single electroless copper plating is sufficient for the through holes but a double electroless copper plating is necessary for the blind holes to ensure complete copper coverage in the bores of the blind holes, by repeating only the catalyzation, activation, and electroless copper plating steps. Second, the electrolessly copper-plated panel is electrolytically copper plated from a conventional acid copper bath or its equivalent. The zinc/nickel/copper coating on the aluminum exposed surface protects this surface from attack by the hydrochloric acid used in the electroless plating processes.

The portion of the copper exposed surface 30 remote from the hole 32 is masked, numeral 84. Masking is preferably accomplished by laminating photoresist over the entire surface 30, and exposing the photoresist with ultraviolet light through a mask that defines an unexposed area around each hole with a diameter about 0.020 inch greater than the diameter of the hole. The unexposed photoresist (overlying the hole) is removed in a photoresist developer.

The panel is remounted in the plating rack.

A bore copper plating is electrolytically applied overlying the copper flash through the openings of the mask, numeral 86. The copper plating is applied from a conventional acid copper solution or its equivalent. The plating is continued for as long as necessary to produce a bore copper plating of the required thickness.

In applications of interest to the inventors, the bore copper plating must be at least 0.001 inch thick, pursuant to MIL-P-55110.

If there is no through hole in the panel, the following steps 88 and 90 may be omitted.

A bore nickel plating is electrolytically applied overlying the bore copper plating through the openings of the mask, numeral 88. The nickel plating is applied from a conventional sulfamate nickel solution as described previously, or its equivalent.

A bore gold plating is electrolytically applied overlying the bore nickel plating through the openings of the mask, numeral 90. The gold plating is applied from a conventional gold plating bath containing gold potassium cyanide or its equivalent.

The bore nickel plating and the bore gold plating protect the bore copper plating in subsequent operations and during service.

The panel is removed from the plating rack at this point.

The photoresist mask that defined the plating areas for the steps 86, 88, and 90 is removed from the copper exposed surface, numeral 92, by immersing the panel 20 in a photoresist stripper.

Photoresist mask material (for a new mask different from that removed in step 92) is applied over the aluminum exposed surface 28, numeral 94, and over the copper exposed surface 30, numeral 96, preferably simultaneously using a vacuum resist laminator. The photoresist on the aluminum exposed surface 28 is not patterned, and serves to protect that surface. The photoresist on the copper exposed surface is patterned as part of step 96 with the final desired circuitry trace pattern required in the copper layer 26 using ultraviolet light, and the unexposed photoresist is removed in a developer.

A layer of tin-lead plating having a composition of about 63 weight percent tin and about 37 weight percent lead is electrolytically applied overlying the exposed copper surface through the openings in the photoresist on the copper exposed surface 30, numeral 98. The tin-lead plating is applied from a conventional tin-lead plating solution containing tin fluoborate, lead fluoborate, fluoboric acid, and grain refiner, or its equivalent. The tin-lead plating serves to protect the copper from being etched in a later stage and to provide a solderable surface.

If there is no through hole in the panel, the following steps 100, 102, 104, and 106 may be omitted.

The masks applied in steps 94 and 96 are removed, numeral 100, by immersing the panel in a photoresist stripper.

Photoresist mask material (for a new mask different from that removed in step 100) is applied over the aluminum exposed surface 28, numeral 102, and over the copper exposed surface 30, numeral 104, preferably simultaneously using a vacuum resist laminator. The photoresist on the aluminum exposed surface 28 is not patterned, and serves to protect that surface. The photoresist on the copper exposed surface 30 is patterned as part of step 104 by exposing the photoresist with ultraviolet light through a mask that defines an unexposed area around each hole with a diameter about 0.010 inch greater than the diameter of the hole. The unexposed photoresist (overlying the hole) is removed in a photoresist developer.

The panel is immersed in a tin-lead stripper to remove the tin-lead plating that is exposed through the mask, numeral 106.

Both sides of the panel are coated with a protective layer, preferably a layer of photoresist material, numeral 108. These protective layers are not patterned.

The panel is machined, numeral 110. "Machined" as used herein means that mounting holes are drilled, physical cuts or slots are formed, and any other required mechanical modifications are made to place the panel in its final physical configuration.

The machining operation of step 110 leaves exposed, unprotected aluminum surfaces. If the photoresist mask is removed during the machining operation, a peelable rubber mask or its equivalent is applied on both sides of the panel except for the exposed, unprotected aluminum surfaces. These aluminum surfaces are protected by repeating the zincating step and the nickel-coating step described previously respectively as steps 72 and 74, numeral 112, but no copper layer is applied. Electroless nickel may be applied instead of electrolytic nickel on the zinc-coated surface. For this step 112, the panel is remounted in the plating rack described previously.

All exposed areas on the panel are gold plated for protection, numeral 114. Gold plating is applied electrolessly or electrolytically using a gold plating solution containing gold potassium cyanide or its equivalent.

All masking is removed from the panel, numeral 116.

The panel is final processed, numeral 118. In final processing, any copper which is not covered with tin-lead plating or nickel/gold plating is etched away by immersing the panel in a conventional ammoniacal etching solution containing ammonium hydroxide and ammonium chloride, or its equivalent. Any moisture in the panels is removed by baking in an oven. The panels are fused in hot oil or its equivalent to complete preparation of the PWB.

Aluminum-backed PWBs with through holes and blind holes have been fabricated with yields of above 90 percent, not counting scrap in the machining operations.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of manufacturing a printed wiring board, comprising the steps of providing a panel having an aluminum backing with an aluminum exposed surface, a dielectric layer overlying and contacting the aluminum backing, and a copper layer overlying and contacting the dielectric layer with a copper exposed surface;

removing contaminants from the aluminum exposed surface and the copper exposed surface;

masking the copper exposed surface;

forming a hole from the copper exposed surface into the aluminum backing, the hole having a bore surface;

supporting the panel from a plating rack having an electrical contact to the aluminum backing but not to the copper layer;

cleaning the aluminum exposed surface;

applying a zinc coating to the aluminum exposed surface;

electrolytically applying a copper-plating over the zinc coating;

removing the panel from the plating rack;

removing the masking from the copper exposed surface;

electrolessly and then electrolytically applying a copper flash to the copper exposed surface and to the bore surface of the hole;

masking that portion of the copper exposed surface remote from the hole;

electrolytically applying a bore copper plating to the bore surface of the hole and the copper exposed surface immediately adjacent to the hole;

removing the masking from the copper exposed surface;

applying a mask overlying the aluminum-exposed surface and overlying the copper-exposed surface;

patterning the copper exposed surface;

depositing a layer of a tin-lead plating overlying the copper exposed surface, so that a tin-lead pattern is formed through openings in the pattern on the copper exposed surface;

machining the panel;

applying a zinc coating to the aluminum exposed surface;

electrolytically applying an aluminum-face nickel plating over the aluminum exposed surface;

applying a gold plating to all exposed areas on the panel;

removing all masking from the panel; and removing unplated copper from the copper exposed surface.

2. The method of claim 1, wherein the step of forming a hole includes the step of forming a blind hole through the copper layer, the dielectric layer, and into but not through the aluminum backing.

3. The method of claim 1, wherein the step of electrolytically applying a bore copper plating to the bore surface of the hole includes the step of supporting the panel at an inclined angle from the vertical.

4. The method of claim 3, wherein the step of electrolytically applying a bore copper plating to the bore surface of the hole includes the step of vibrating the panel.

5. The method of claim 1, wherein the step of electrolytically applying a bore copper plating to the bore surface of the hole includes the step of supporting the panel at an inclined angle of from about 25 to about 45 degrees from the vertical.

6. The method of claim 5, wherein the step of electrolytically applying a bore copper plating to the bore surface of the hole includes the step of vibrating the panel.

7. The method of claim 1, including an additional step, after the step of applying a zinc coating and before the step of electrolytically applying a copper plating, of electrolytically applying a nickel plating over the zinc coating on the aluminum exposed surface.

8. The method of claim 1, including additional steps, after the step of electrolytically applying a bore copper plating and before the step of removing the masking, of applying a bore nickel plating overlying the bore copper plating; and applying a bore gold plating overlying the bore nickel plating.

9. The method of claim 1, including an additional step, after the step of depositing a layer of a tin-lead plating and before the step of machining the panel, of removing the tin-lead plating from the copper surface adjacent to the hole and from the hole bore surface.

10. The method of claim 1, including additional steps after the step of applying a zinc coating and before the step of electrolytically applying a copper plating, of electrolytically applying a nickel plating over the aluminum exposed surface;

after the step of electrolytically applying a bore copper plating and before the step of removing the masking, of applying a bore nickel plating overlying the bore copper plating; and applying a bore gold plating overlying the bore nickel plating; and after the step of depositing a layer of a tin-lead plating and before the step of machining the panel, of removing the tin-lead plating from the copper surface adjacent to the hole and from the hole bore surface.

11. The method of claim 10, wherein the step of forming a hole includes the step of forming a through hole through the copper layer, the dielectric layer, and the aluminum backing.

12. A method of manufacturing a printed wiring board, comprising the steps of providing a panel having an aluminum backing with an aluminum exposed surface, a dielectric layer overlying and contacting the aluminum backing, and a copper layer overlying and contacting the dielectric layer with a copper exposed surface;

removing contaminants from the aluminum exposed surface and the copper exposed surface;

masking the copper exposed surface;

forming a hole from the copper exposed surface into the aluminum backing, the hole having a bore surface;

supporting the panel from a plating rack having an electrical contact to the aluminum backing but not to the copper layer;

cleaning the aluminum exposed surface;

applying a zinc coating to the aluminum exposed surface;

electrolytically applying a nickel plating over the aluminum exposed surface;

electrolytically applying a copper plating over the aluminum-face nickel plating;

removing the panel from the plating rack;

removing the masking from the copper exposed surface;

electrolessly and then electrolytically applying a copper flash to the copper exposed surface and to the bore surface of the hole;

masking that portion of the copper exposed surface remote from the hole;

electrolytically applying a bore copper plating to the bore surface of the hole and the copper exposed surface immediately adjacent to the hole;

applying a bore nickel plating overlying the bore copper plating;

applying a bore gold plating overlying the bore nickel plating;

removing the masking from the copper exposed surface;

applying a mask overlying the aluminum-exposed surface and overlying the copper-exposed surface;

patterning the copper exposed surface;

depositing a layer of a tin-lead plating overlying the copper exposed surface, so that a tin-lead pattern is formed through openings in the pattern on the copper exposed surface;

removing the tin-lead plating from the copper surface adjacent to the hole and from the hole bore surface;

machining the panel;

applying a zinc coating to the aluminum exposed surface;

electrolytically applying an aluminum-face nickel plating over the aluminum exposed surface;

applying a gold plating to all exposed areas on the panel by an electrolytic or electroless deposition procedure;

removing all masking from the panel; and removing unplated copper from the copper exposed surface.

13. A method of manufacturing a printed wiring board, comprising the steps of providing a panel having an aluminum backing with an aluminum exposed surface, a dielectric layer overlying and contacting the aluminum backing, and a copper layer overlying and contacting the dielectric layer with a copper exposed surface;

masking the copper exposed surface;

forming a hole from the copper exposed surface into the aluminum backing, the hole having a bore surface;

supporting the panel from a plating rack having an electrical contact to the aluminum backing but not to the copper layer;

cleaning the aluminum exposed surface;

applying a zinc coating to the aluminum exposed surface;

electrolytically applying an aluminum-face nickel plating over the aluminum exposed surface;

electrolytically applying an aluminum-face copper plating over the aluminum-face nickel plating;

removing the panel from the plating rack;

removing the masking from the copper exposed surface;

electrolessly and then electrolytically applying a copper flash to the copper exposed surface and to the bore surface of the hole;

masking that portion of the copper exposed surface remote from the hole;

electrolytically applying a bore copper plating to the bore surface of the hole and the copper exposed surface immediately adjacent to the hole;

applying a bore nickel plating overlying the bore copper plating;

applying a bore gold plating overlying the bore nickel plating;

removing the masking from the copper exposed surface;

applying a mask overlying the aluminum-exposed surface and over the copper-exposed surface;

patterning the copper exposed surface;

depositing a layer of a tin-lead plating overlying the copper exposed surface, so that a tin-lead pattern is formed through openings in the pattern on the copper exposed surface;

removing the tin-lead plating from the copper surface adjacent to the hole and from the hole bore surface;

machining the panel;

applying a zinc coating to the aluminum exposed surface;

electrolytically applying an aluminum-face nickel plating over the aluminum exposed surface;

applying a gold plating to all exposed areas on the panel;

removing all masking from the panel; and removing unplated copper from the copper exposed surface.

* * * * *